United States Patent [19]

Paolella et al.

[11] Patent Number: 4,859,965

[45] Date of Patent: Aug. 22, 1989

[54] OPTICAL GAIN CONTROL OF GAAS MICROWAVE MONOLITHIC INTEGRATED CIRCUIT DISTRIBUTED AMPLIFIER

[75] Inventors: Arthur Paolella, Howell, N.J.; Peter R. Herczfeld, Philadelphia, Pa.

[73] Assignee: The United States of America as represented by the Secretary of the Army, Washington, D.C.

[21] Appl. No.: 316,358

[22] Filed: Feb. 27, 1989

[51] Int. Cl.$^4$ .............................................. H03G 3/30
[52] U.S. Cl. ..................................... 330/285; 330/54; 330/277; 330/308
[58] Field of Search ................... 330/54, 59, 277, 285, 330/308

[56] References Cited

U.S. PATENT DOCUMENTS 4,595,881 6/1986 Kennan ........................... 330/277 X Primary Examiner—James B. Mullins
Attorney, Agent, or Firm—Michael J. Zelenka; Robert A. Maikis

[57] ABSTRACT

An optical gain control circuit for controlling the gain of a GaAs MMIC distributed amplifier having a dc gain control is provided. Variable intensity light from a controlled LED is directed to the surface of a GaAs multifinger FET by means of an optical fiber. The FET is gate biased to a point near pinch-off to maximize its light sensitivity and the drain and source of the FET are serially connected with a fixed resistance in a dc voltage divider circuit so that the output of the voltage divider circuit changes as a function of the change in light intensity of the LED. A MMIC operational amplifier connected in an inverter mode is coupled between the output of the voltage divider circuit and the dc gain control of the distributed amplifier to control the gain of that amplifier.

6 Claims, 2 Drawing Sheets

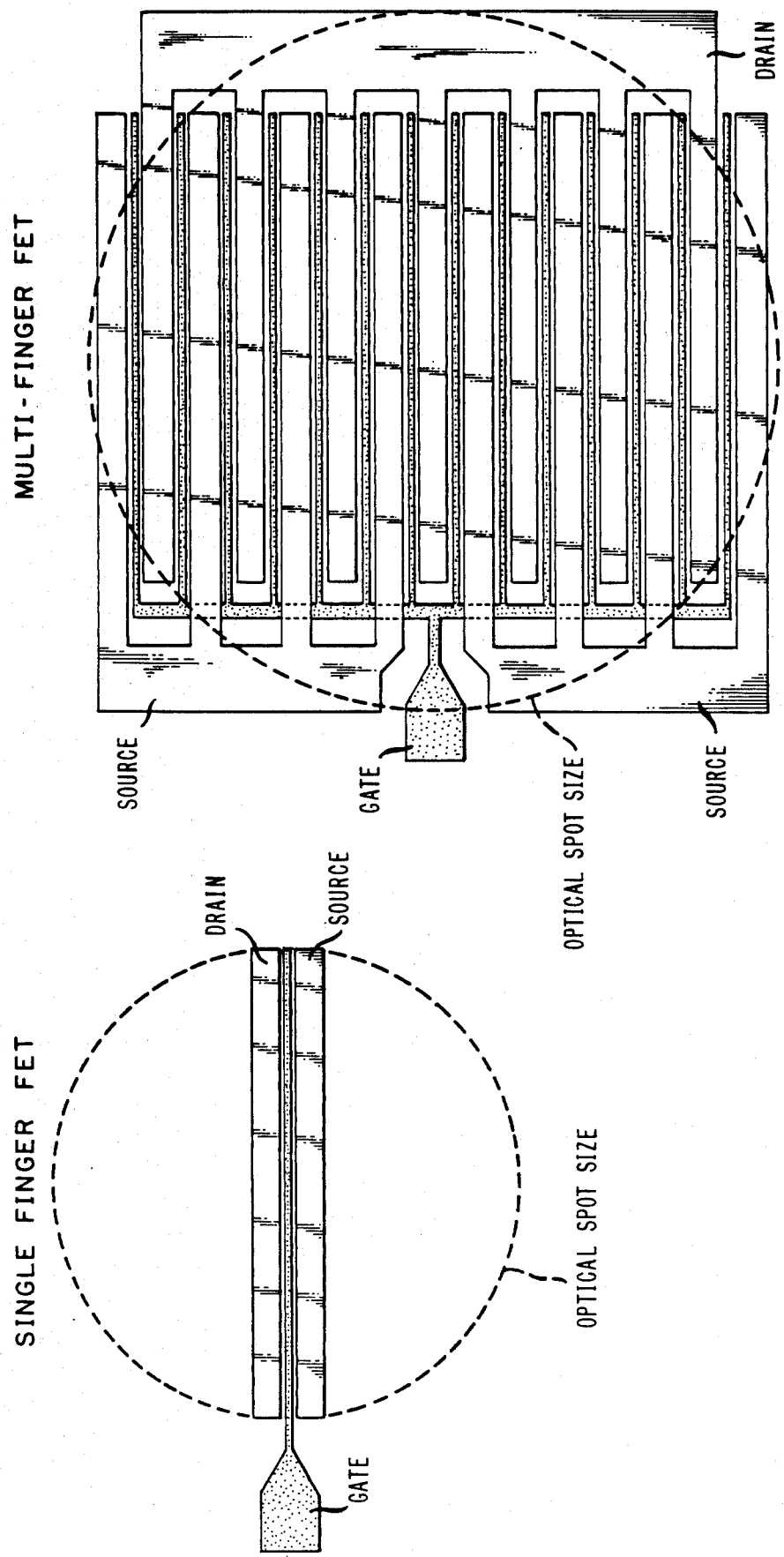

OPTICAL GAIN CONTROL OF GAAS MICROWAVE MONOLITHIC INTEGRATED CIRCUIT DISTRIBUTED AMPLIFIER

BACKGROUND OF THE INVENTION

1. Field of the Invention

This invention relates to optical control of microwave circuits and systems and more particularly to an optical gain control circuit for controlling the gain of a gallium arsenide (GaAs) microwave monolithic integrated circuit (MMIC) distributed amplifier.

2. Description of the Prior Art

The utilization of light to control microwave devices and microwave subsystems is highly desirable because the light signals could be distributed and handled by optical fibers which offer advantages such as high speed, large bandwidth, good electrical isolation and elimination of grounding problems. Additionally, the optical fiber itself is small in size and light in weight and is immune to electromagnetic interference and electromagnetic pulses. The use of optical signals for controlling microwave systems also permits optical computing and optical signal processing techniques to be utilized. Because of the foregoing advantages, the development of effective and reliable optical control systems to control the microwave and millimeter wave devices used in radar systems and the like is very important. For example, the developement of these systems could lead to remote control of the transmit-receive modules which are used in phased array antenna systems or the optical control technique could be utilized to control the microwave amplifiers which are used in antenna beamforming applications. Since microwave devices and systems are fabricated utilizing monolithic integrated circuit technology wherever possible because of cost, size, weight and overall performance considerations, it would also be desirable to devoepe light control systems for microwave devices which utilize this technology.

Although some attempts have been made to control the performance of microwave devices, such as Impatt diodes and field effect transistors FET's), for example, by direct optical illumination, the results have not been particularly successful. These attempts have utilized high speed, high frequency FETs and optical fibers to inject light into the active region of the FET between the gate and the source or the drain, so that the absorbed photons from the light generate electron-hole pairs which alter the performance of the FET. The difficulty with this work has been the poor coupling of the light into the active region of the FET and the resulting limited change in the performance of the FET. The geometry of a high speed, high frequency FET, namely, its relatively large gatewidth which is of the order of several hundred micrometers and very short gatelength which is of the order of a micrometer or less, is fundamentally incompatible with a typical cylindrical light spot emerging from the end of an optical fiber.

SUMMARY OF THE INVENTION

It is an object of this invention to provide an optical gain control circuit for controlling the gain of a GaAs MMIC distributed amplifier which is suitable for use in applications in the microwave region of the frequency spectrum.

It is further object of this invention to provide an optical gain control circuit for controlling the gain of a GaAs MMIC distributed amplifier which readily lends itself to fabrication by monolithic integrated circuit technology.

It is a still further object of this invention to provide an optical gain control circuit for controlling the gain of a GaAs MMIC distributed amplifier which is independent of the operating frequency of the microwave components which it controls and which can be extended to applications in the millimeter range of the frequency spectrum.

It is an additional object of this invention to provide an optical gain control circuit for controlling the gain of a GaAs MMIC distributed amplifier which may be fabricated of low cost, commercially available MMIC's.

It is another object of this invention to provide an optical gain control circuit for controlling the gain of a GaAs MMIC distributed amplifier which produces a very significant change in microwave performance in response to a small variation in light intensity.

Briefly, the optical gain control circuit of the invention comprises a GaAs MMIC distributed amplifier having a dc bias control for controlling the gain of the amplifier and a light source for emitting light at a wavelength in the region of 0.5 micrometers to 1 micrometer. Control means are coupled to the light source to control the intensity of the light emitted from the source. Also provided are a fixed resistance, a GaAs multi-finger FET having parallel connected sources, parallel connected drains and parallel connected gate fingers, and circuit means for connecting the sources and drains of the FET in series circuit with the fixed resistance across a source of positive dc voltage. Gate biasing means coupled to the gates of the FET serve to bias the FET to a point near pinch-off to maximize the light sensitivity of the FET. Finally, the optical control circuit of the invention includes dc amplifier means having an input coupled to the circuit junction of the fixed resistance and the FET and an output coupled to the dc bias control of the GaAs MMIC distributed amplifier, and means optically coupled to the light source and the FET for focussing light from the light source on the surface of the FET between the sources and the drains of the FET and covering substantially all of the gate fingers of the FET, whereby changes in the intensity of light from the light source change the voltage drop across the FET and the input applied to the dc amplifier means to thereby change the gain of the MMIC distributed amplifier.

The nature of the invention and other objects and additional advantages thereof will be more readily understood by those skilled in the art after consideration of the following detailed description taken in conjunction with the accompanying drawings.

BRIEF DESCRIPTION OF THE DRAWINGS

In the drawings:

FIG. 2 is a schematic diagram of a single finger FET and a multi-finger FET showing the increase in active surface area of the multi-finger FET available for light control purposes when both types of FET are illuminated by a spot of light.

DESCRIPTION OF THE PREFERRED EMBODIMENT OF THE INVENTION

Figure 1:
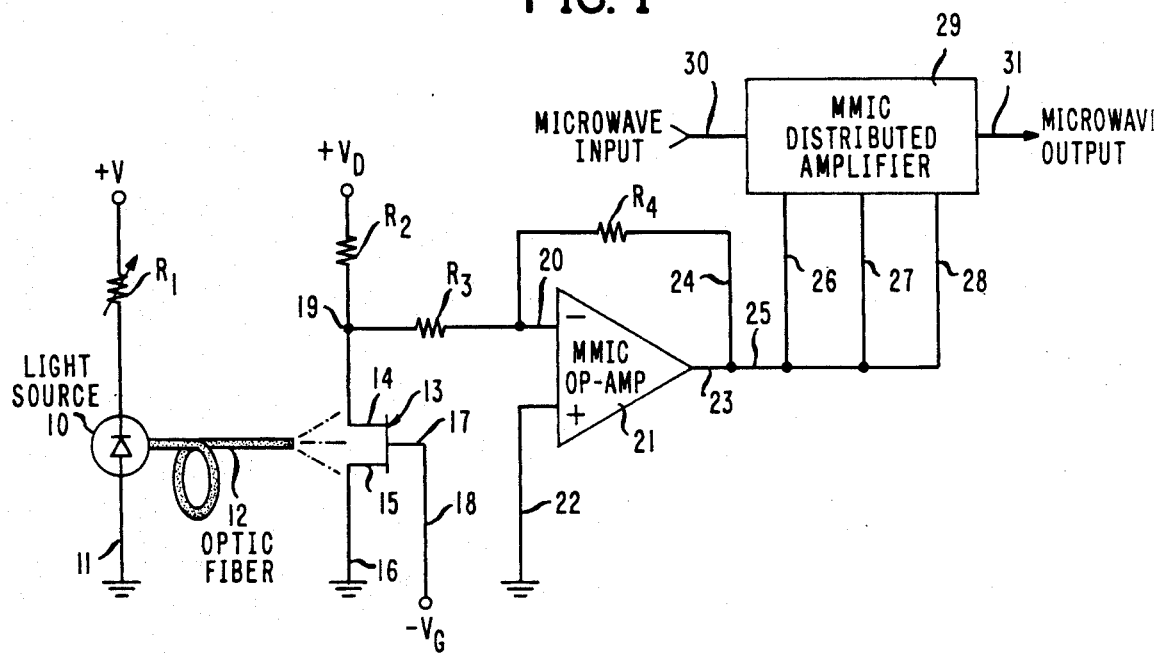
FIG. 1 is a schematic circuit diagram of the optical gain control circuit of the invention.

Referring now to FIG. 1 of the drawings, there is shown an optical gain control circuit constructed in accordance with the teachings of the present invention comprising a light source 10 which is connected in series circuit with a variable resistance $R_1$ across a source V of positive dc voltage by means of a lead 11. The light source 10 should emit light at a wavelength in the region of 0.5 micrometers to 1 micrometer because light in this wavelength region is capable of altering the performance of a GaAs FET. As illustrated in FIG. 1, the light source 10 may comprise a light emitting diode (LED), such as the pig-tailed LED manufactured by Laser Diode, Inc., No. IRE-160FA, for example. This LED is capable of producing 300 microwatts of power at a wavelength of 835 nanometers. The intensity of the light from the LED 10 may be varied by the variable resistance $R_1$ which acts as the control means for the optical control circuit of the invention.

An optic fiber 12 is optically coupled to the LED light source 10 and to a FET, indicated generally as 13. If the aforementioned pig-tailed LED is utilized as the light source, the pig-tail itself is an optic fiber and may be utilized as the optic fiber 12 in the circuit of the invention. This fiber is a graded index fiber with a core diameter of 100 micrometers and a cladding diameter of 140 micrometers. The FET 13 should be a GaAs multi-finger FET having parallel connected sources, parallel connected drains and parallel connected gate fingers for reasons which will be explained hereinafter. A suitable FET, for example, would be a NEC NE868196 which has 14 gate fingers connected to a single gate bonding pad. The end of the optic fiber 12 which is optically coupled to the FET 13 should focus the light from the source 10 on the active surface of the FET 13 between the sources and the drains of the FET and the focus light spot should cover substantially all of the gate fingers of the FET.

The parallel connected drains 14 and the parallel connected sources 15 of the FET 13 are connected in series circuit with a fixed resistance $R_2$ across a source $V_D$ of positive dc voltage by means of a lead 16. The parallel connected gates 17 of the FET are connected by a lead 18 to a source $V_G$ of negative dc voltage which should be of sufficient magnitude to bias the FET 13 to a point near pinch-off of the FET. Pinch-off is usually defined as the value of gate voltage that causes the drain current of the FET to be at 10% of its full value. This is done to maximize the light sensitivity of the FET 13 because it has been found that the maximum change in operating performance of a GaAs FET in response to light directed onto the surface of the FET occurs at a point at or near pinch-off.

The circuit junction 19 between the serially-connected FET 13 and the fixed resistance $R_2$ is connected by means of a resistance $R_3$ and a lead 20 to the negative input of a MMIC operational amplifier 21. The operational amplifier 21 has its positive input connected to ground by means of a lead 22 so that the input signal applied to the operational amplifier through resistance $R_3$ is essentially the drain to source voltage of the FET 13. The output of the amplifier 21 is coupled in a feedback loop to its negative input by means of leads 23 and 24, resistance $R_4$ and lead 20 so that the gain of the amplifier is determined by the resistance ration $R_4/R_3$. The amplifier 21 may comprise, for example, a GaAs MMIC operational amplifier such as No. AOP1510 which is manufactured by Anadigics, Inc. This chip provides 70 dB of open loop gain and unity gain stable operation at 150 MHz.

The output of the operational amplifier 21 is coupled by leads 23, 25, 26, 27 and 28 to the gate bias of a MMIC distributed amplifier 29 which has a microwave input 30 and a microwave output 31. The distributed amplifier 29 may comprise a GaAs MMIC distributed amplifier manufactured by Microwave Semiconductor Corp. which has four FETs that are tied to a common dc bias pad to allow for gain control of the amplifier with a single dc input voltage. The distributed amplifier 29 controls the gain of microwave signal passing through it via its input 30 and output 31 so that it may be used for high frequency control purposes, such as the previously mentioned radar applications, for example.

In operation, as the intensity of the light emitted from the LED 10 is changed by operation of the variable resistance $R_1$ or other control means, the number of photons striking the surface of the FET 13 is correspondingly changed so that the drain to source voltage drop across the FET 13 is also changed. Since the FET 13 and the fixed resistance $R_2$ are connected in series circuit across a fixed dc voltage source, they act as a voltage divider circuit so that the positive voltage appearing between circuit junction point 19 and ground changes in accordance with the change in light intensity. The operational amplifier 21 is connected in its inverter mode of operation so that its output signal is a negative voltage which may be directly applied to the dc bias control of the distributed amplifier 29.

Figure 3:
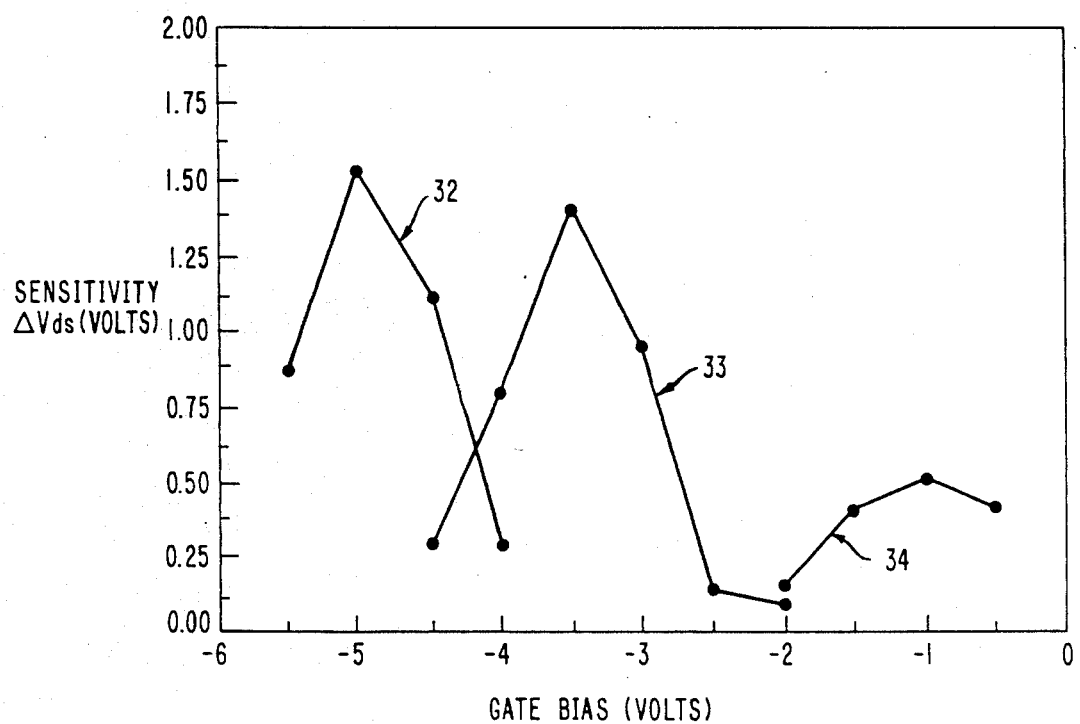
FIG. 3 is a graphical representation of the optical sensitivity of two different multi-finger FETs and a single finger FET as a function of gate bias.

It is important that the GaAs FET 13 be a multi-finger FET rather than a single finger FET because the multi-finger FET has a greater optical sensitivity than a single finger FET. FIG. 2 shows the schematic layout of the drain, source and gate of a single finger FET in relation to an optical spot such as would be produced by the optic fiber 12. For convenience of illustration, the substrate of the FET has been omitted. It will be noted however that only a very small amount of light strikes the exposed GaAs surface which is between the drain and the source. Since this is the critical area for light sensitivity, i.e., the area between the drain and the source, it is seen that all but an extremely small amount of the light in the spot is wasted because it does not contribute to the voltage drop change in the FET. FIG. 2 also shows the parallel connected sources, parallel connected drains and parallel connected gate fingers of a multi-finger FET in relation to a light spot. Since there are more sources and more drains there will be more active surface areas of the GaAs which receive the light and the optical sensitivity of the multi-finger FET will increase because of this. The active area of the GaAs surface between the sources and drains is approximately 2-3% of the total illuminating area of the light spot which is an order of magnitude greater than could be achieved with a single finger FET. FIG. 3 is a graphical representation of optical sensitivity (the change in drain to source voltage) plotted as a function of gate bias voltage for two commercially available, multi-finger FETs and a single commercially available, single finger FET. It will be noted that curves 32 and 33 which represent the optical sensitivity of the two multi-finger FETs have a maximum optical sensitivity which is approximately three times greater than the maximum optical sensitivity of the single finger FET which is represented by curve 34.

It should be pointed out that the FET 13, the operational amplifier 21 and the distributed amplifier 29 are all compatible with GaAs MMIC fabrication methods so that these three components may be integrated into a single MMIC chip. Additionally, the light source 10, the FET detector 13, the operational amplifier 21 and associated circuit components which provide the dc bias signal for the distributed amplifier 29 all operate independently of the operating frequency of the input-output signals being handled by the distributed amplifier 29 so that the control of components operating in the millimeter wave region of the frequency spectrum is possible. Finally, all of the components employed in the optical gain control circuit of the invention are comercially available components so that the circuit may be manufactured and produced at reasonable cost. With the components mentioned herein and with 250 microwatts of optical power from the light source the gain change of the distributed amplifier 29 is about 15 dB in the frequency change of 5 to 8 GHz.

It is believed apparent that many changes could be made in the construction and described uses of the foregoing optical gain control circuit and many seemingly different embodiments of the invention could be constructed without departing from the scope thereof. For example, by substituting a semiconductor laser for the LED as the light source, the circuit of the invention may be utilized for pulse code modulation purposes. Accordingly, it is intended that all matter contained in the above description or shown in the accompanying drawings shall be interpreted as illustrative and not in a limiting sense.

What is claimed is:

1. An optical gain control circuit for controlling the gain of a GaAs MMIC distributed amplifier comprising
    a GaAs MMIC distributed amplifier having a dc bias control for controlling the gain of the amplifier;
    a light source for emitting light at a wavelength in the region of 0.5 micrometers to 1 micrometer;
    control means coupled to said light source for controlling the intensity of the light emitted from said source;
    a fixed resistance;
    a GaAs multi-finger FET having parallel connected sources, parallel connected drains and parallel connected gate fingers;
    circuit means for connecting the sources and drains of said FET in series circuit with said fixed resistance across a source of positive dc voltage;
    gate biasing means coupled to the gates of said FET for biasing said FET to a point near pinch-off to maximize the light sensitivity of the FET;
    dc amplifier means having an input coupled to the circuit junction of said fixed resistance and said FET and an output coupled to said dc bias control of said GaAs MMIC distributed amplifier; and
    means optically coupled to said light source and said FET for focussing light from said light source on the surface of said FET between the sources and the drains of the FET and covering substantially all of the gate fingers of the FET, whereby changes in the intensity of light from said light source change the voltage drop across said FET and the input applied to said dc amplifier means to thereby change the gain of said MMIC distributed amplifier.

2. An optical gain control circuit as claimed in claim 1 wherein said means optically coupled to said light source and said FET for focussing light from said light source on the surface of said FET is an optic fiber.

3. An optical gain control circuit as claimed in claim 2 wherein said light source is a LED.

4. An optical gain control circuit as claimed in claim 2 wherein said light source is a semiconductor laser.

5. An optical gain control circuit as claimed in claim 3 wherein said dc amplifier means is an operational amplifier connected in an inverter operating mode.

6. An optical gain control circuit as claimed in claim 5 wherein said gate biasing means is a source of negative dc voltage coupled to the gates of said FET.

* * * * *